(12) United States Patent
Tsuji et al.

(10) Patent No.: US 7,955,511 B2
(45) Date of Patent: Jun. 7, 2011

(54) SILICA GLASS CRUCIBLE

(75) Inventors: Yoshiyuki Tsuji, Akita (JP); Toshio Tsujimoto, Akita (JP)

(73) Assignee: Japan Super Quartz Corporation, Tokyo (JP)

( * ) Notice: Subject to any disclaimer, the term of this patent is extended or adjusted under 35 U.S.C. 154(b) by 0 days.

(21) Appl. No.: 12/717,390

(22) Filed: Mar. 4, 2010

(65) Prior Publication Data
US 2010/0154703 A1 Jun. 24, 2010

Related U.S. Application Data

(62) Division of application No. 10/801,683, filed on Mar. 17, 2004, now Pat. No. 7,695,787.

(30) Foreign Application Priority Data

Mar. 28, 2003 (JP) ................. 2003-092146

(51) Int. Cl.
- *B44C 1/22* (2006.01)
- *C04B 35/00* (2006.01)
- *F16L 9/10* (2006.01)
- *F27B 14/10* (2006.01)

(52) U.S. Cl. ........ 216/52; 117/220; 428/34.1; 428/34.4; 432/262; 501/1

(58) Field of Classification Search .............. 428/34.4, 428/34.1; 117/220; 216/52; 432/262; 501/1
See application file for complete search history.

(56) References Cited

U.S. PATENT DOCUMENTS

| 2,947,114 | A | 8/1960 | Hill |
| 4,010,064 | A | 3/1977 | Patrick et al. |
| 4,403,955 | A | 9/1983 | Sarno |
| 5,976,247 | A | 11/1999 | Hansen et al. |
| 6,150,006 | A | 11/2000 | Hellmann et al. |
| 6,524,668 | B1 | 2/2003 | Tsuji et al. |
| 6,548,131 | B1 * | 4/2003 | Fabian et al. ............... 428/34.4 |
| 2002/0078886 | A1 | 6/2002 | Segawa et al. |
| 2002/0086119 | A1 | 7/2002 | Hariharan et al. |
| 2003/0024467 | A1 | 2/2003 | Phillips et al. |

FOREIGN PATENT DOCUMENTS

| JP | 753295 | 2/1995 |
| JP | 09-110590 | 4/1997 |
| JP | 10-203893 | 8/1998 |
| JP | 2001-89198 | 4/2001 |
| JP | 2001-328831 | 11/2001 |
| JP | 2004-107163 | 4/2004 |

* cited by examiner

*Primary Examiner* — Brent T O'Hern
(74) *Attorney, Agent, or Firm* — Oblon, Spivak, McClelland, Maier & Neustadt, L.L.P.

(57) ABSTRACT

A silica glass crucible used for pulling up silicon single crystal at a high temperature. The silica glass crucible may have at least an outer surface of a wall part of the crucible covered with fine grooves having a length of less than 200 μm, a width of less than 30 μm and a depth of from more than 3 μm to less than 30 μm. The fine groves may be formed by carrying out a sand-blast treatment and a hydrofluoric acid etching and may exist on more than 10% of the outer surface of the crucible, and a sliding frictional coefficient of the outer surface of the crucible to a carbon at 1500° C. is more than 0.6.

9 Claims, No Drawings

SILICA GLASS CRUCIBLE

BACKGROUND OF THE INVENTION

1. Field of the Invention

The present invention relates to a silica glass crucible used for pulling up single crystal silicon used for a semiconductor from melted silicon.

2. Discussion of the Prior Art

In recent years, a silica glass crucible having a large open diameter has been used in accordance with an enlargement of a silicon wafer, and a thermal load on the silica glass crucible becomes to be increased since a melting amount is increased and a pulling up time is long, thus there is a problem that the silica glass crucible is sunk during the pulling up. Then, the silica glass crucible being reinforced by crystallizing an inner or outer surface of the crucible has been known for preventing the sinking.

For example, in Japanese Patent Laid Open No. Hei09-110590, it was described that the crucible can be reinforced by coating an agent for accelerating the crystallization on the outer surface of the crucible and crystallizing the crucible during the pulling up. However, the agent for accelerating the crystallization is an impurity for the single crystal silicon and may have a bad influence on an electric characteristic of the produced wafer. Further, in Japanese Patent Laid Open No. Hei10-203893, it was described that an oxyhydrogen flame is sprayed on the outer surface of the crucible to form a crystallized glass layer on the outer surface of the crucible. When the silica glass is heated at more than a softening point under an oxygen atmosphere, cristobalite is deposited during a cooling process. However, since a thermal expansion coefficient of the silica glass is much different from that of cristobalite, the cristobalite layer formed by said method is easily released, thus this method is not suitable for utilization.

On the other hand, in Japanese Patent Laid Open No. 2001-328831, the silica glass crucible was described, wherein the whole inner surface of the crucible is polished by a sand-blast or the like, and the polished surface is further heated and treated with the oxyhydrogen flame to be smoothed. It was pointed out that said silica glass crucible had an advantage that a ratio of single crystallization could be increased since bubbles were not contained in the inner surface and the purity was high. However, the problem of the sinking of the crucible is not solved.

Problems to be Solved

The present invention solves the above-mentioned problems in the conventional silica glass crucible, and provides the silica glass crucible, in which an adhesibility of the crucible with a carbon susceptor supporting the silica glass crucible is good, and the sinking of the crucible during the pulling up process of single crystal silicon can be effectively prevented.

SUMMARY OF THE INVENTION

The present invention provides the silica glass crucible having following constitutions.

[1] A silica glass crucible used for pulling up single crystal silicon, wherein at least an outer surface of a wall part of the crucible is covered with fine grooves having a length of less than 200 μm, a width of less than 30 μm and a depth of from more than 3 μm to less than 30 μm.

[2] The silica glass crucible according to above [1], wherein the fine grooves exist on more than 10% of the outer surface of the crucible.

[3] The silica glass crucible according to above [1] or [2], wherein a sliding frictional coefficient of the outer surface of the crucible to a carbon at 1500 degree C. is more than 0.6.

[4] The silica glass crucible according to above [1], [2] or [3], wherein the outer surface of the crucible is covered with the fine grooves by carrying out a sand-blast treatment and a hydrofluoric acid etching to the outer surface.

[5] The silica glass crucible according to any one of from above [1] to [4],
wherein the number of projections having a height of 0.1 mm or more is an average of less than 5/mm$^2$ per unit area on the outer surface of the crucible.

DESCRIPTION OF THE PREFERRED EMBODIMENTS

The silica glass crucible used for pulling up the single crystal silicon has been mainly produced by the method, heating and fusing the quartz powder layer stored in the inner surface of a rotational mold, and vitrifying it. As for the silica glass crucible, the un-melted quartz powder is adhered on the outer surface of the crucible immediately after producing said silica glass crucible in an arc furnace. Although said un-melted quartz powder can be removed with high-pressure water, the projections having the height of about 0.1 mm or more exist so much on the outer surface of the crucible. From this reason, it can be understood clearly that the adhesibility of the silica glass crucible with the carbon susceptor is low.

Since the silica glass crucible is softened at the high temperature to decrease the strength, the silica glass crucible is reinforced by taking it into the susceptor made with carbon to be used at the time of pulling up the single crystal silicon in general. As the carbon susceptor, a graphite material having the high strength at the high temperature, the high heat resistance, and the high heat conductivity has been used in general. In addition, the thermal expansion coefficient of the silica glass is much different from that of the graphite. So, while repeating the heating and cooling, the silica glass crucible is softened to be adhered with the graphite crucible at the time of heating. On the other hand, at the time of cooling, since a shrinking amount of the graphite crucible is increased as compared with that of the silica glass crucible, the graphite crucible is received an internal pressure from the silica glass crucible, thus there is a problem that the susceptor is deformed or broken. Then, in order to prevent the damage by the difference of the thermal expansion coefficients, the division type susceptor has been used in general. However, the large type susceptor becomes to be used in accordance with the enlargement of the open diameter of the single crystal in recent years, thus it is pointed out that the workability is decreased since the weight of said susceptor is increased. Then, the trial has been carried out to use a carbon fiber-reinforced carbon material (C/C material) for the carbon susceptor, which has the excellent specific strength and specific modulus even has the light weight as compared with the graphite material and has the few differences of the thermal expansion coefficient with the silica. The silica glass crucible of the present invention has the excellent adhesibility to such the carbon susceptor.

The silica glass crucible of the present invention is the crucible, in which the adhesibility to the susceptor can be increased by surface treating the outer surface of the crucible after removing the un-melted quartz powder, and covering at least the outer surface of the wall part of the crucible with the fine grooves having the length of less than 200 μm, the width of less than 30 μm and the depth of from more than 3 μm to less than 30 μm. If the size of the fine grooves is within said ranges, the carbon fiber is easily engaged with the fine groove even when the carbon fiber-reinforced carbon material (C/C material) is used, thus the frictional coefficient is increased and the adhesibility can be increased.

It is preferable that the fine grooves cover at least the outer surface of the wall part of the crucible, and are more than 10% of the whole outer surface of the crucible. When this area of the outer surface of the crucible is covered with the fine grooves, it is possible to obtain the silica glass crucible having the high adhesibility, in which the sliding frictional coefficient of the outer surface of the crucible to the carbon is more than 0.6 at the high temperature, for example, at 1500 degree C. at the time of pulling up the single crystal silicon.

The fine grooves covering the outer surface of the crucible can be formed, for example, by carrying out the sand-blast treatment and the hydrofluoric acid etching to the outer surface of the crucible. The sand-blast treatment is the polishing method by spraying the hard particles with high pressure gas. As the hard particles, a carbide or a nitride of silicon, alumina, diamond, crystalline quartz or the like, which are the materials having the higher hardness than that of the silica glass, can be used. Further, in order to prevent the contamination of the crucible with the hard particle, it is preferable to use the crystalline quartz.

In order to carry out the sand-blast treatment, the crucible is put on a turntable, and an injection nozzle is moved along with the wall part of the outer surface of the crucible. Although the sand-blast treatment can be carried out to the whole outer surface of the crucible, said treatment may be carried out to only the wall part in order to prevent a buckling of the wall part. By this sand-blast treatment, the projections having a large size on the outer surface of the crucible can be removed, and the contact area with the carbon susceptor becomes large, and further, the frictional coefficient is increased, thus the buckling of the crucible can be prevented.

After the sand-blast treatment, the inner and outer surfaces of the crucible are washed with the hydrofluoric acid. By washing the inner surface with the hydrofluoric acid, the quartz powder or the like entered into the inside of the crucible is washed away. Further, by washing the outer surface with the hydrofluoric acid, the polished quartz powder is washed away, and the above-mentioned fine grooves are formed. In the sand-blast treatment, since the hard particles are sprayed on the outer surface, a micro crack is generated on the surface together with removing the projections having the large size. The above-mentioned fine grooves are formed by washing the outer surface of the crucible, in which the micro crack is generated, with the hydrofluoric acid to be etched. Said fine grooves are useful especially at the time of using the carbon susceptor of the C/C material. A diameter of the carbon fiber consisting the C/C material is about 10 μm, and the carbon fiber is twisted with said fine grooves having the width of 5 to 30 μm, thus the frictional coefficient is further increased.

By the above-mentioned sand-blast treatment, the number of the projections having the height of 0.1 mm or more on the outer surface of the crucible can be decreased to less than 5/mm$^2$ per unit area. Further, by covering more than 10% of the whole outer surface of the silica glass crucible with the above-mentioned fine grooves after washing it with the hydrofluoric acid, it is possible to obtain the silica glass crucible having the high adhesibility, in which the sliding frictional coefficient of the outer surface of the crucible to the carbon is more than 0.6 at the high temperature, for example, at 1500 degree C. at the time of pulling up the single crystal silicon, as mentioned above.

EXAMPLES

The sand-blast treatment was carried out to the wall part (the cylindrical part) of the silica glass crucible having the open diameter of 24 inches. As for the sand-blast apparatus, a commercial apparatus (AV-2EH type, produced by Atsuchi Tekko Co., Ltd) was used, and the natural quartz particles having the particle diameter of about 200 μm were used as the injection particles in order not to reduce the purity of the crucible. Further, as the high pressure gas, the compressed air having an atmospheric pressure of 6 was used. The feeding amount of the injection particles was about 1.7 kg/minute. After the sand-blast treatment, the inner and outer surfaces of the crucible were washed with the hydrofluoric acid for 5 minutes to remove the contamination generated by the sand-blast. After the washing treatment, when the outer surface of the crucible was observed by the SEM, about 50% of the outer surface carried out the sand-blast treatment was covered with the fine grooves having the length of 10 to 100 μm and the width of about 10 μm.

The sample piece having the size of 50 mm square was cut out from said crucible to measure the frictional coefficient. The frictional coefficient was measured under the conditions at the time of pulling up, that is, at 1500 degree C., under an argon gas atmosphere, and at 20 torr. The end of a carbon member having the width of 60 mm and the length of 300 mm was equipped with the supporting rod made with carbon, which could move up and down, and said supporting rod was moved at the temperature of 1500 degree C., and then, the frictional coefficient was measured from an angle of inclination at the time of moving the sample piece on the carbon member. As the carbon member, the graphite material and the C/C material were used. As the comparison, the frictional coefficient of the sample piece, which was not carried out the sand-blast treatment, was measured. These results were shown in Table 1. The sample pieces carried out the treatment of the present invention had about twice frictional coefficient to the both of the graphite material and the C/C material as compared with that of the comparison pieces.

TABLE 1

| | Frictional Coefficient with Graphite | Frictional Coefficient with C/C Material |
|---|---|---|
| Sand-blast Treated Sample | 0.8 (40°) | 1.2 (50°) |
| No Sand-blast Treated Sample | 0.4 (20°) | 0.5 (25°) |

(Note)
The value in a parenthesis is an angle of inclination.

EFFECTIVENESS OF THE INVENTION

As for the silica glass crucible of the present invention, since the adhesibility with the susceptor is excellent at the high temperature, the sinking or the buckling can be prevented when said crucible is used for pulling up the single crystal silicon, thus the rate of single crystallization can be increased.

What is claimed is:
1. A process for forming fine grooves on at least an outer surface of a wall part of a silica glass crucible used for pulling silicon single crystal, wherein the silica glass crucible has a wall part, an open diameter, an inner surface, and the outer surface; and a graphite susceptor adhered to the outer surface of the silica glass crucible, comprising carrying out a sand-blast treatment and a hydrofluoric acid etching on the said surface;

wherein after the sand blast treatment and the hydrofluoric acid etching at least the outer surface of the wall part of the crucible is covered with fine grooves having a length of from 10 μm, to 200 μm, a width of from 10 μm to 30 μm and a depth of from more than 3 μm to less than 30 μm; and wherein a sliding frictional coefficient of the outer surface of the crucible to the graphite susceptor at 1500° C. is more than 0.6, and wherein a number of projections having a height of 0.1 mm or more is an average of less than 5/mm$^2$ per unit area on the outer surface of the crucible.

2. The process for forming fine grooves according to claim 1, wherein the sand-blast treatment includes spraying hard particles having a higher hardness than that of the silica glass crucible with a pressurized gas against the outer surface of the wall part of the silica glass crucible.

3. The process for forming fine grooves according to claim 2, wherein the hard particles are crystalline quartz particles.

4. The process of claim 1, wherein the fine grooves are present on more than 10% of the whole outer surface of the silica glass crucible.

5. The process of claim 1, wherein the fine grooves have a depth of from more than 3 μm to 10 μm.

6. The process of claim 1, wherein the fine grooves have a length of from 10 μm to 100 μm.

7. The process of claim 1, wherein the fine grooves are present only on the outer surface of the silica glass crucible.

8. The process of claim 1, wherein the fines grooves are present on more than 50% of the whole outer surface of the silica glass crucible.

9. A process for forming fine grooves on an outer surface of a wall part of a silica glass crucible having the wall part, an open diameter, an inner surface, the outer surface, and a graphite susceptor adhered to the outer surface of the silica glass crucible; comprising:

sand-blasting and hydrofluoric acid etching the outer surface of the wall part of the silica glass crucible, wherein the sand-blasting and the hydrofluoric acid etching form fine grooves on at least the outer surface of the wall part of the silica glass crucible, wherein the fine grooves having a length of from 10 μm to 200 μm, a width of from 10 μm to 30 μm and a depth of from more than 3 μm to less than 30 μm, and wherein the outer surface of the wall part of the silica glass crucible has an average of less than 5 projections having a height of 0.1 mm or more per mm$^2$ unit area, and wherein a sliding frictional coefficient of the outer surface of the crucible to the graphite susceptor at 1500° C. is more than 0.6.

* * * * *